United States Patent [19]

Ohlstein

[11] 4,061,263

[45] Dec. 6, 1977

[54] METHOD OF BONDING A DIELECTRIC SUBSTRATE TO A METALLIC CARRIER IN A PRINTED CIRCUIT ASSEMBLY

[75] Inventor: Herbert Ohlstein, Elmwood Park, N.J.

[73] Assignee: International Telephone and Telegraph Corporation, Nutley, N.J.

[21] Appl. No.: 725,204

[22] Filed: Sept. 22, 1976

[51] Int. Cl.² .................................. B23K 31/02
[52] U.S. Cl. ......................... 228/124; 228/165; 228/170
[58] Field of Search ............. 228/122, 123, 124, 170, 228/254, 172, 903

[56] References Cited

U.S. PATENT DOCUMENTS

| | | | |
|---|---|---|---|
| 1,956,233 | 4/1934 | Braun | 228/170 X |
| 2,149,008 | 2/1939 | Chapman | 228/165 X |
| 3,279,284 | 10/1966 | Ogden | 228/174 X |
| 3,284,176 | 11/1966 | Reed | 228/174 X |
| 3,337,947 | 8/1967 | Terrill | 228/165 |
| 3,363,308 | 1/1968 | Lueck | 228/123 X |
| 3,390,447 | 7/1968 | Mears | 228/174 |
| 3,648,357 | 3/1972 | Green, Jr. | 228/254 X |
| 3,921,885 | 11/1975 | Knox | 228/121 X |

Primary Examiner—Donald G. Kelly
Attorney, Agent, or Firm—John T. O'Halloran; Alfred C. Hill

[57] ABSTRACT

The method comprises the steps of plating at least one surface of the substrate with a metal with the one surface of the substrate to be bonded to a given surface of the metallic carrier, forming a plurality of vent holes in the given surface, tinning the plated one surface and the given surface separately with solder, cleaning the tinned plated one surface and the tinned given surface separately to clean both of the tinned surfaces, applying a flux to both of the cleaned tinned surfaces separately, placing both of the fluxed cleaned tinned surfaces in contact with each other, applying heat and pressure simultaneously to both of the substrate and the carrier until the solder of both of the fluxed cleaned tinned surfaces flows, and cooling both of the substrate and the carrier in a natural manner to room temperature while still applying the pressure to both the substrates to the carrier. The plurality of vent holes remove excess flux and solder during the step of applying heat and pressure to provide an intimate bonded contact between both of the surfaces and to prevent the solder from flowing onto undesirable areas.

50 Claims, 2 Drawing Figures

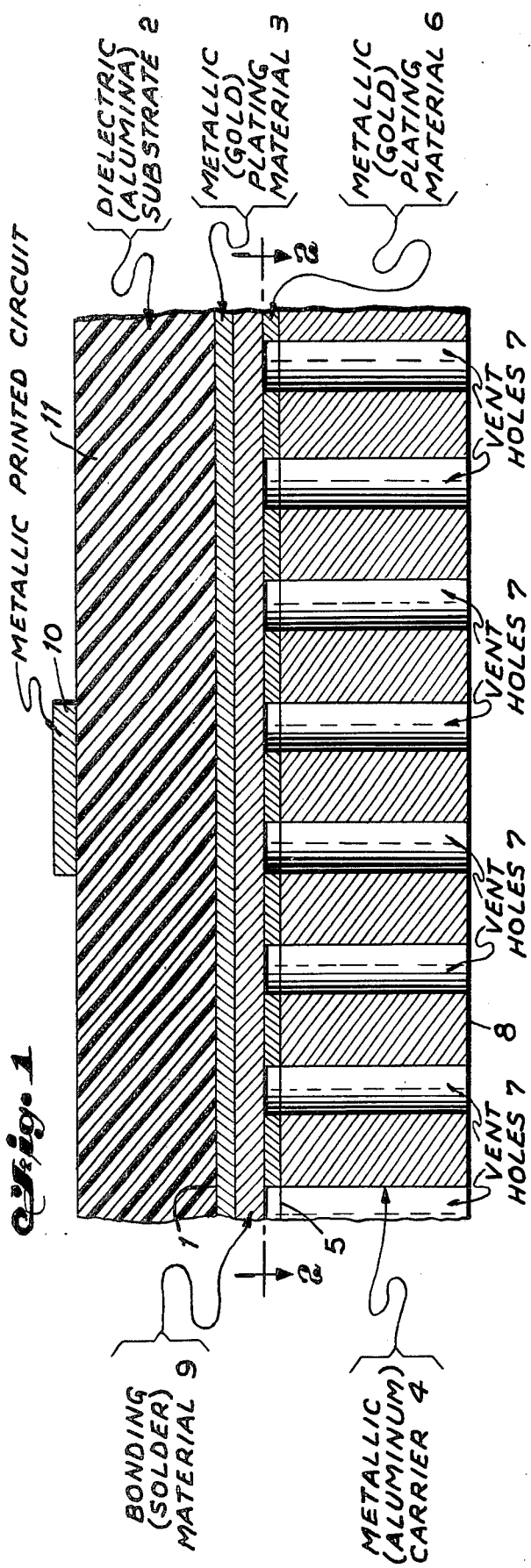
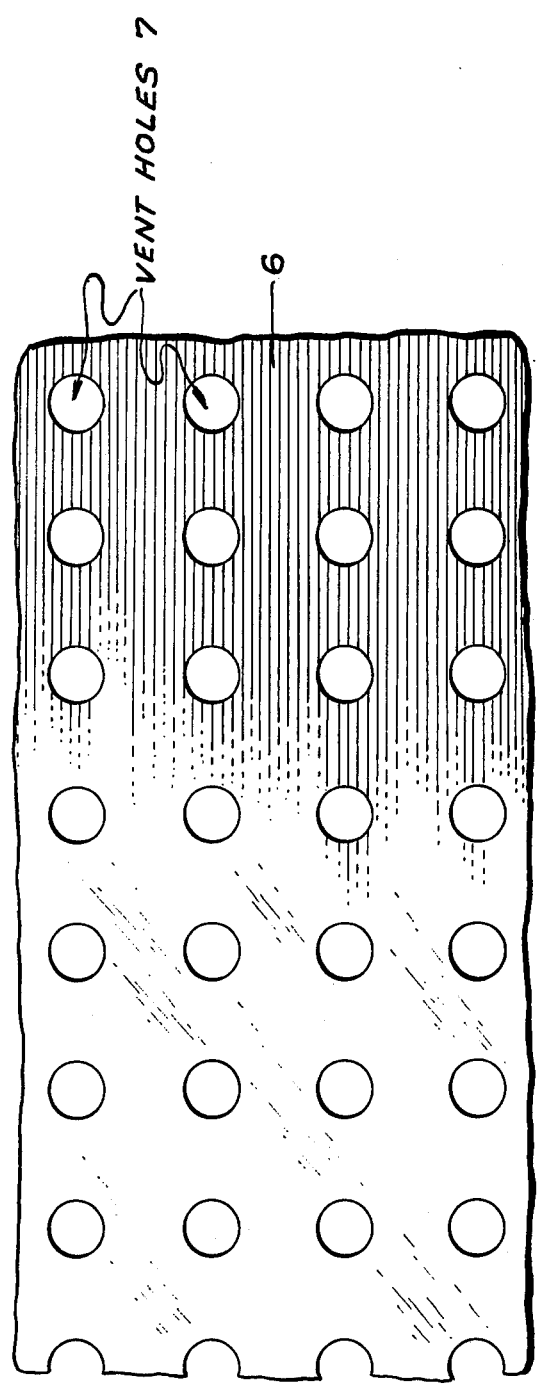

METHOD OF BONDING A DIELECTRIC SUBSTRATE TO A METALLIC CARRIER IN A PRINTED CIRCUIT ASSEMBLY

BACKGROUND OF THE INVENTION

The present invention relates to printed circuit assemblies and more particularly to a method of bonding a surface of the dielectric substrate to a surface of the metallic carrier of a printed circuit assembly.

In the past it has been the practice of plating the surface of the substrate to be bonded to a surface of the carrier with a metal and then tinning both of these surfaces separately with solder. The tinned surfaces are separately cleaned to clean both of the tinned surfaces. A flux is applied to both of the cleaned tinned surfaces separately and both of the fluxed cleaned tinned surfaces are placed in contact with each other. Heat and pressure is then simultaneously applied to both of the substrate and the carrier until the solder of both of the fluxed cleaned tinned surfaces flows. Both of the bodies are then allowed to cool in a natural manner to room temperature while still applying the pressure to bond the substrate to the carrier.

A disadvantage of this method of bonding a substrate to a carrier in printed circuit assemblies is that intimate contact between the bonded surfaces may not be achieved due to trapped flux and additionally excess solder will flow out onto undesirable areas of the substrate and carrier, such as the outer surface of the substrate and the carrier adjacent the bonded joint.

SUMMARY OF THE INVENTION

An object of the present invention is to provide a method of bonding a dielectric substrate to a metallic carrier of a printed circuit assembly overcoming the disadvantage of the above-mentioned prior art method.

A feature of the present invention is the provision of a method of bonding a dielectric body to a metallic body comprising the steps of: plating at least one surface of the dielectric body with a metal, the one surface to be bonded to a given surface of the metallic body; forming a plurality of vent means in the given surface; tinning the plated one surface and the given surface separately with solder; cleaning the tinned plated one surface and the tinned given surface separately to clean both of the tinned surfaces; applying a flux to both of the cleaned tinned surfaces separately; placing both of the fluxed cleaned tinned surfaces in contact with each other; applying heat and pressure simultaneously to both of the bodies until the solder of both of the fluxed cleaned tinned surfaces flows; and cooling both of the bodies in a natural manner to room temperature while still applying the pressure to bond the dielectric body to the metallic body; the plurality of vent means removing excess flux and solder during the step of applying heat and pressure to provide an intimate bonded contact between both of the surfaces and to prevent the solder from flowing onto undesirable areas.

BRIEF DESCRIPTION OF THE DRAWING

Above-mentioned and other features and objects of this invention will become more apparent by reference to the following description taken in conjunction with the accompanying drawing, in which:

FIG. 1 is a cross-sectional view of a printed circuit assembly employing the method of bonding the dielectric substrate to the metallic carrier in accordance with the principles of the present invention with the thickness of the various components of the assembly and the diameter of the vent holes being greatly exaggerated for clarity; and FIG. 2 is a cross-sectional view along lines 2—2 of FIG. 1.

DESCRIPTION OF THE PREFERRED EMBODIMENT

Referring to FIGS. 1 and 2, at least one surface 1 of dielectric substrate 2 is plated with a metallic plating material 3. The dielectric substrate 2 may be any known dielectric material but as a preferred embodiment is composed of alumina ($Al_2O_3$). The metallic plating material 3 may be any suitable metallic material easily applied to surface 1. In the preferred embodiment plating material 3 is gold which may be placed on surface 1 by well known vaporizing techniques. Surface 1 of substrate 2 is to be bonded to surface 5 of metallic carrier 4. Metallic carrier 4 may be composed of any suitable metal and in the preferred embodiment carrier 4 is composed of aluminum. Due to the difficulty of soldering aluminum, a metallic plating material 6 is vaporized upon surface 5 of carrier 4. As with plating material 3, plating material 6 may be any suitable metal, however, in the preferred embodiment the metal employed is gold. The plating of surface 5 may be eliminated if the metal of carrier 4 can be easily tinned. Vent holes 7 are formed in carrier 4 by drilling a plurality of holes from surface 5 through carrier 4 to surface 8 parallel to surface 5. Vent holes 7 may be drilled in carrier 4 by employing a drill jig with as many drills having the desired spacing therebetween as the number of desired vent holes 7.

Plating material 3 of substrate 2 and plating material 6 of carrier 4 are tinned by applying flux and solder to materials 3 and 6 with substrate 2 and carrier 4 separated from each other. Substrate 2 and carrier 4 are then separately heated to a temperature of approximately 150° C (centigrade) at which temperature the solder will flow. Substrate 2 and carrier 4 are then allowed to separately cool in a natural manner to room temperature.

The cooled separated substrate 2 and carrier 4 have the tinned surfaces thereof cleaned. The cleaning process includes the step of dipping each of the tinned surfaces separately into water, wiping the water from each of the tinned surfaces separately with a tissue, dipping each of the tinned surfaces separately in Freon and wiping the Freon from each of the tinned surfaces separately with a tissue. A flux is then applied to both of the cleaned tinned surfaces separately and the cleaned tinned surfaces are then placed in contact with each other. Heat and pressure is then simultaneously applied to substrate 2 and carrier 4 until the solder of both of the tinned surfaces flows. The solder flows due to the applied heat at a temperature of approximately 150° C and the pressure applied to the substrate 2 and carrier 4 is approximately 2 psi (pounds per square inch). At this point in the process substrate 2 and carrier 4 are allowed to cool in a natural manner to room temperature while still applying the pressure to cause a bond between the plated surfaces 1 and 5 such as illustrated by bonding material 9 in the form of solder.

The printed circuit assembly is then completed by plating the desired metallic circuit 10 on surface 11 of substrate 2 by well known printed circuit techniques.

The vent holes 7 remove excess flux to prevent the trapping of flux between plated surfaces 1 and 5 and thus provides an intimate bonded contact between plated surfaces 1 and 5 and remove excess solder to prevent the solder from flowing into undesirable areas, such as the outer surface of carrier 4 and substrate 2 adjacent the bonded joint.

While I have described above the principles of my invention in connection with specific apparatus it is to be clearly understood that this description is made only by way of example and not as a limitation to the scope of my invention as set forth in the objects thereof and in the accompanying claims.

I claim:

1. A method of bonding a dielectric body to a metallic body comprising the steps of:
   plating at least one surface of said dielectric body with a metal, said one surface to be bonded to a given surface of said metallic body;
   forming a plurality of vent means in said given surface;
   tinning said plated one surface and said given surface separately with solder;
   cleaning said tinned plated one surface and said tinned given surface separately to clean both of said tinned surfaces;
   applying a flux to both of said cleaned tinned surfaces separately;
   placing both of said fluxed cleaned tinned surfaces in contact with each other;
   applying heat and pressure simultaneously to both of said bodies until said solder of both of said fluxed cleaned tinned surfaces flows; and
   cooling both of said bodies in a natural manner to room temperature while still applying said pressure to bond said dielectric body to said metallic body;
   said plurality of vent means removing excess flux and solder during said step of applying heat and pressure to provide an intimate bonded contact between both of said surfaces and to prevent said solder from flowing onto undesirable areas.

2. A method according to claim 1, wherein
said dielectric body is a substrate of a printed circuit assembly, and
said metallic body is a carrier for said substrate of a printed circuit assembly.

3. A method according to claim 2, wherein
said substrate is composed of alumina.

4. A method according to claim 3, wherein
said step of plating said one surface includes
   the step of vaporizing gold on said one surface.

5. A method according to claim 4, wherein
said step of forming said plurality of vent means includes
   the step of drilling a plurality of holes through said carrier from said given surface to a surface of said carrier parallel to said given surface.

6. A method according to claim 5, wherein
said carrier is composed of aluminum; and said method further includes the step of
plating said given surface with a metal prior to said step of tinning.

7. A method according to claim 6, wherein
said step of plating said given surface includes
   the step of vaporizing gold on said given surface.

8. A method according to claim 7, wherein
said step of tinning includes
   the step of applying flux and solder to both of said surfaces separately,
   the step of heating both of said bodies separately to a temperature where said solder flows; and
   the step of cooling both of said bodies separately in a natural manner to room temperature.

9. A method according to claim 8, wherein
said temperature is approximately 150° C.

10. A method according to claim 9, wherein
said step of cleaning includes
   the step of dipping both of said tinned surfaces separately in water,
   the step of wiping said water from both of said tinned surfaces separately,
   the step of dipping both of said tinned surfaces separately in Freon, and
   the step of wiping said Freon from both of said surfaces separately.

11. A method according to claim 10, wherein
said step of applying heat and pressure includes
   the step of heating said bodies simultaneously to a temperature of approximately 150° C, and
   the step of applying a pressure of approximately two pounds per square inch simultaneously to both of said bodies.

12. A method according to claim 1, wherein
said dielectric body is composed of alumina.

13. A method according to claim 12, wherein
said step of plating said one surface includes
   the step of vaporizing gold on said one surface.

14. A method according to claim 13, wherein
said step of forming said plurality of vent means includes
   the step of drilling a plurality of holes through said metallic body from said given surface to a surface of said metallic body parallel to said given surface.

15. A method according to claim 14, wherein
said metallic body is composed of aluminum; and said method further includes the step of
plating said given surface with a metal prior to said step of tinning.

16. A method according to claim 15, wherein
said step of plating said given surface includes
   the step of vaporizing gold on said given surface.

17. A method according to claim 16, wherein
said step of tinning includes
   the step of applying flux and solder to both of said surfaces separately,
   the step of heating both of said bodies separately to a temperature where said solder flows; and
   the step of cooling both of said bodies separately in a natural manner to room temperature.

18. A method according to claim 17, wherein
said temperature is approximately 150° C.

19. A method according to claim 18, wherein
said step of cleaning includes
   the step of dipping both of said tinned surfaces separately in water,
   the step of wiping said water from both of said tinned surfaces separately,
   the step of dipping both of said tinned surfaces separately in Freon, and
   the step of wiping said Freon from both of said surfaces separately.

20. A method according to claim 19, wherein
said step of applying heat and pressure includes the step of heating said bodies simultaneously to a temperature of approximately 150° C, and the step of applying a pressure of approximately two pounds per square inch simultaneously to both of said bodies.

21. A method according to claim 1, wherein
said step of plating said one surface includes
the step of vaporizing gold on said one surface.

22. A method according to claim 21, wherein
said step of forming said plurality of vent means includes
the step of drilling a plurality of holes through said metallic body from said given surface to a surface of said metallic body parallel to said given surface.

23. A method according to claim 22, wherein
sais metallic body is composed of aluminum; and said method further includes the step of
plating said given surface with a metal prior to said step of tinning.

24. A method according to claim 23, wherein
said step of plating said given surface includes
the step of vaporizing gold on said given surface.

25. A method according to claim 24, wherein
said step of tinning includes
the step of applying flux and solder to both of said surfaces separately,
the step of heating both of said bodies separately to a temperature where said solder flows; and
the step of cooling both of said bodies separately in a natural manner to room temperature.

26. A method according to claim 25, wherein
said temperature is approximately 150° C.

27. A method according to claim 26, wherein
said step of cleaning includes
the step of dipping both of said tinned surfaces separately in water,
the step of wiping said water from both of said tinned surfaces separately,
the step of dipping both of said tinned surfaces separately in Freon, and
the step of wiping said Freon from both of said surfaces separately.

28. A method according to claim 27, wherein
said step of applying heat and pressure includes
the step of heating said bodies simultaneously to a temperature of approximately 150° C, and
the step of applying a pressure of approximately two pounds per square inch simultaneously to both of said bodies.

29. A method according to claim 1, wherein
said step of forming said plurality of vent means includes
the step of drilling a plurality of holes through said metallic body from said given surface to a surface of said metallic body parallel to said given surface.

30. A method according to claim 29, wherein
said metallic body is composed of aluminum; and said method further includes the step of
plating said given surface with a metal prior to said step of tinning.

31. A method according to claim 30, wherein
said step of plating said given surface includes
the step of vaporizing gold on said given surface.

32. A method according to claim 31, wherein
said step of tinning includes
the step of applying flux and solder to both of said surfaces separately,
the step of heating both of said bodies separately to a temperature where said solder flows; and
the step of cooling both of said bodies separately in a natural manner to room temperature.

33. A method according to claim 32, wherein
said temperature is approximately 150° C.

34. A method according to claim 33, wherein
said step of cleaning includes
the step of dipping both of said tinned surfaces separately in water,
the step of wiping said water from both of said tinned surfaces separately,
the step of dipping both of said tinned surfaces separately in Freon, and
the step of wiping said Freon from both of said surfaces separately.

35. A method according to claim 34, wherein
said step of applying heat and pressure includes
the step of heating said bodies simultaneously to a temperature of approximately 150° C, and
the step of applying a pressure of approximately two pounds per square inch simultaneously to both of said bodies.

36. A method according to claim 1, wherein
said metallic body is composed of aluminum; and said method further includes the step of
plating said given surface with a metal prior to said step of tinning.

37. A method according to claim 36, wherein
said step of plating said given surface includes
the step of vaporizing gold on said given surface.

38. A method according to claim 37, wherein
said step of tinning includes
the step of applying flux and solder to both of said surfaces separately,
the step of heating both of said bodies separately to a temperature where said solder flows; and
the step of cooling both of said bodies separately in a natural manner to room temperature.

39. A method according to claim 38, wherein
said temperature is approximately 150° C.

40. A method according to claim 39, wherein
said step of cleaning includes
the step of dipping both of said tinned surfaces separately in water,
the step of wiping said water from both of said tinned surfaces separately,
the step of dipping both of said tinned surfaces separately in Freon, and
the step of wiping said Freon from both of said surfaces separately.

41. A method according to claim 40, wherein
said step of applying heat and pressure includes
the step of heating said bodies simultaneously to a temperature of approximately 150° C, and
the step of applying a pressure of approximately two pounds per square inch simultaneously to both of said bodies.

42. A method according to claim 1, wherein
said step of tinning includes
the step of applying flux and solder to both of said surfaces separately,
the step of heating both of said bodies separately to a temperature where said solder flows; and
the step of cooling both of said bodies separately in a natural manner to room temperature.

43. A method according to claim 42, wherein said temperature is approximately 150° C.

44. A method according to claim 43, wherein said step of cleaning includes
- the step of dipping both of said tinned surfaces separately in water,
- the step of wiping said water from both of said tinned surfaces separately,
- the step of dipping both of said tinned surfaces separately in Freon, and
- the step of wiping said Freon from both of said surfaces separately.

45. A method according to claim 44, wherein said step of applying heat and pressure includes
- the step of heating said bodies simultaneously to a temperature of approximately 150° C, and
- the step of applying a pressure of approximately two pounds per square inch simultaneously to both of said bodies.

46. A method according to claim 1, wherein said step of cleaning includes
- the step of dipping both of said tinned surfaces separately in water,
- the step of wiping said water from both of said tinned surfaces separately,
- the step of dipping both of said tinned surfaces separately in Freon, and
- the step of wiping said Freon from both of said surfaces separately.

47. A method according to claim 46, wherein said step of applying heat and pressure includes
- the step of heating said bodies simultaneously to a temperature of approximately 150° C, and
- the step of applying a pressure of approximately two pounds per square inch simultaneously to both of said bodies.

48. A method according to claim 1, wherein said step of applying heat and pressure includes
- the step of heating said bodies simultaneously to a temperature of approximately 150° C, and
- the step of applying a pressure of approximately two pounds per square inch simultaneously to both of said bodies.

49. A method of bonding a first body of a given material to a second body of a material different than said given material comprising the steps of:
- forming a plurality of vent means in a given surface of one of said first and second bodies;
- tinning said given surface and one surface of the other of said first and second bodies separately with solder, said one surface to be bonded to said given surface;
- cleaning said tinned given surface and said tinned one surface separately to clean both of said tinned surfaces;
- applying a flux to both of said cleaned tinned surfaces separately;
- placing both of said fluxed cleaned tinned surfaces in contact with each other;
- applying heat and pressure simultaneously to both of said first and second bodies until said solder of both of said fluxed cleaned tinned surfaces flows; and
- cooling both of said bodies in a natural manner to room temperature while still applying said pressure to bond said first body to said second body;
- said plurality of vent means removing excess flux and solder during said step of applying heat and pressure to provide an intimate bonded contact between both of said surfaces and to prevent said solder from flowing onto undesirable areas.

50. A method according to claim 49, wherein said step of forming said plurality of vent means includes
- the step of drilling a plurality of holes through said one of said first and second bodies from said given surface to a surface of said one of said first and second bodies parallel to said given surface.

* * * * *